(12) United States Patent
Lutz

(10) Patent No.: US 6,459,268 B1
(45) Date of Patent: Oct. 1, 2002

(54) RELAY CIRCUIT TEST EXTENDER

(76) Inventor: Kevin W. Lutz, 18211 English Walnut La., Charlotte, NC (US) 28215

( * ) Notice: Subject to any disclaimer, the term of this patent is extended or adjusted under 35 U.S.C. 154(b) by 0 days.

(21) Appl. No.: 09/897,561

(22) Filed: Jul. 2, 2001

(51) Int. Cl.$^7$ ............................................... G01R 31/02
(52) U.S. Cl. ......................................................... 324/418
(58) Field of Search ................................ 324/418, 383, 324/503, 538, 555, 400; 439/638

(56) References Cited

U.S. PATENT DOCUMENTS

| | | |
|---|---|---|
| 3,944,915 A | 3/1976 | Yonce |
| 4,195,257 A | 3/1980 | Yoshida et al. |
| 4,215,306 A | 7/1980 | Mace |
| 4,540,940 A | 9/1985 | Nolan |
| 4,542,335 A | 9/1985 | Williams |
| 4,700,126 A | 10/1987 | Hill |
| 4,740,745 A | 4/1988 | Sainz |
| 4,924,398 A | 5/1990 | Fujiwara |
| 4,999,574 A | 3/1991 | Stephens |
| 5,530,360 A | 6/1996 | Kerchaert et al. |
| 5,635,841 A * | 6/1997 | Taylor ........................ 324/380 |
| 6,124,716 A | 9/2000 | Kanamori |

* cited by examiner

*Primary Examiner*—Michael Nghiem
(74) *Attorney, Agent, or Firm*—Adams, Schwartz & Evans, P.A.

(57) ABSTRACT

A relay circuit test extender is adapted to facilitate testing of relays and relay circuits in a vehicle. The test extender includes a plurality of elongated bundled wires having first and second opposing ends, and adapted for carrying current in an electric circuit between a vehicle relay receptacle and a removable electric relay. A male connector is located at the first end of the bundled wires, and includes a plurality of electric pins electrically connected to respective wires and adapted for being inserted into respective pin openings of the vehicle relay receptacle. A female connector is located at the second end of the bundled wires, and defines a plurality of pin openings adapted for receiving respective pins of the removable electric relay. Upon connecting the male connector of the test extender to the vehicle relay receptacle and connecting the removable electric relay to the female connector of the test extender, the relay is tested in a live electric circuit at a location spaced apart from the vehicle relay receptacle.

12 Claims, 4 Drawing Sheets

RELAY CIRCUIT TEST EXTENDER

TECHNICAL FIELD AND BACKGROUND OF THE INVENTION

This invention relates to a relay circuit test extender. The invention is a diagnostic tool designed to facilitate the accessibility and testing of any given electrical relay or relay circuit in a vehicle, such as an automobile. Testing is performed quickly and conveniently while the relay remains electrically connected in the circuit, thus providing a live, unopened circuit for proper and thorough diagnosis. The invention allows an automobile technician to "extend" a relay-controlled circuit at the relay box in the automobile. This extension provides for easier testing by locating the relay and the relay circuit away from often hard to reach areas by a distance of two or more feet, while providing test ports for back probing the circuits.

The current testing procedure for a relay-controlled circuit requires that voltage be checked at two of the relay receptacles, with the relay removed. While this procedure checks for correct voltage, it will not determine circuit problems with high resistance, which will prevent a circuit from operating properly. Also, using this procedure, the circuit is not being tested while operating (under a load), thus errors can occur. A further test is to check for voltage coming out of a relay. This test cannot be performed unless the circuits are "live" and under a load. In order to energize the circuits, the relay must remain plugged into its receptacle. This requires accessing the wires of the circuit. The relay receptacle box must be removed for access to the relay circuit wires for back probing. This is often a time consuming, complex, and intricate process. Many times difficulty arises due to the relay circuit wire not being long enough for testing. Confusion can also result because of repetitive wire colors, which can lead to improper diagnosis.

SUMMARY OF THE INVENTION

Therefore, it is an object of the invention to provide a relay circuit test extender which facilitates the accessibility and testing of any given electrical relay or relay circuit in a vehicle.

It is another object of the invention to provide a relay circuit test extender which allows a technician to test a relay controlled circuit (all branches), and the relay itself, with just one tool, in a simple step by step process.

It is another object of the invention to provide a relay circuit test extender which is capable of extending a relay circuit for testing by two feet or more.

It is another object of the invention to provide a relay circuit test extender which allows the relay circuit to be tested while energized by retaining the relay in the circuit.

It is another object of the invention to provide a relay circuit test extender which provides test ports for testing the relay circuits.

It is another object of the invention to provide a relay circuit test extender which is capable of testing any relay controlled circuit in the middle of the overall circuit.

These and other objects of the present invention are achieved in the preferred embodiments disclosed below by providing a relay circuit test extender adapted to facilitate testing of relays and relay circuits in a vehicle. The test extender includes a plurality of elongated bundled wires having first and second opposing ends, and adapted for carrying current in an electric circuit between a vehicle relay receptacle and a removable electric relay. A male connector is located at the first end of the bundled wires, and includes a plurality of electric pins electrically connected to respective wires and adapted for being inserted into respective pin openings of the vehicle relay receptacle. A female connector is located at the second end of the bundled wires, and defines a plurality of pin openings adapted for receiving respective pins of the removable electric relay. Upon connecting the male connector of the test extender to the vehicle relay receptacle and connecting the removable electric relay to the female connector of the test extender, the relay is tested in a live electric circuit at a location spaced apart from the vehicle relay receptacle.

According to another preferred embodiment of the invention, the female connector includes a connector housing. The housing defines a plurality of back probe ports communicating with the plurality of wires to enable ready access to the wires for back probe testing.

According to another preferred embodiment of the invention, the bundled plurality of wires is contained in a flexible conduit.

According to another preferred embodiment of the invention, the length of the bundled plurality of wires is greater than two feet.

According to another preferred embodiment of the invention, the male connector has five electric pins and the female connector has five corresponding pin openings, such that the test extender is adapted for testing a removable four or five-pin electric relay.

According to another preferred embodiment of the invention, the female connector includes a connector housing. The housing defines five back probe ports communicating with respective wires to enable ready access to the wires for back probe testing.

According to another preferred embodiment of the invention, indicia are provided on the connector housing and associated with each of the back probe ports to match the back probe ports to respective wires.

According to another preferred embodiment of the invention, the indicia are numbers identifying each of the wires.

In another embodiment, the invention is a method for testing relays and relay circuits in a vehicle. The method includes the step of electrically connecting a male connector of a relay circuit test extender to a vehicle relay receptacle. The test extender includes a plurality of electric wires adapted for carrying current. A female connector of the relay circuit test extender is then located a distance away from the vehicle relay receptacle. A removable electric relay is electrically connected to the female connector, such that the relay is tested in a live electric circuit at a location spaced apart from the vehicle relay receptacle.

According to another preferred embodiment of the invention, the method includes testing the voltage from the removable electric relay by inserting a voltage testing device into back probe ports formed in the female connector of the relay circuit test extender.

According to another preferred embodiment of the invention, the step of testing the voltage from the removable electric relay includes inserting a digital volt-ohm meter into the back probe ports of the female connector.

According to another preferred embodiment of the invention, the method includes the step of locating the female connector of the relay circuit test extender a distance of at least two feet from the vehicle relay receptacle.

BRIEF DESCRIPTION OF THE DRAWINGS

Some of the objects of the invention have been set forth above. Other objects and advantages of the invention will appear as the description proceeds when taken in conjunction with the following drawings, in which.

DESCRIPTION OF THE PREFERRED EMBODIMENT AND BEST MODE

Figure 1:
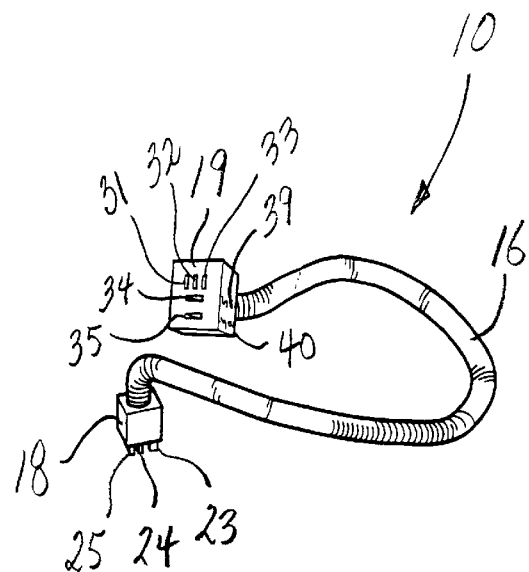
FIG. 1 is a perspective view of a relay circuit test extender according to one preferred embodiment of the invention.
Figure 3:
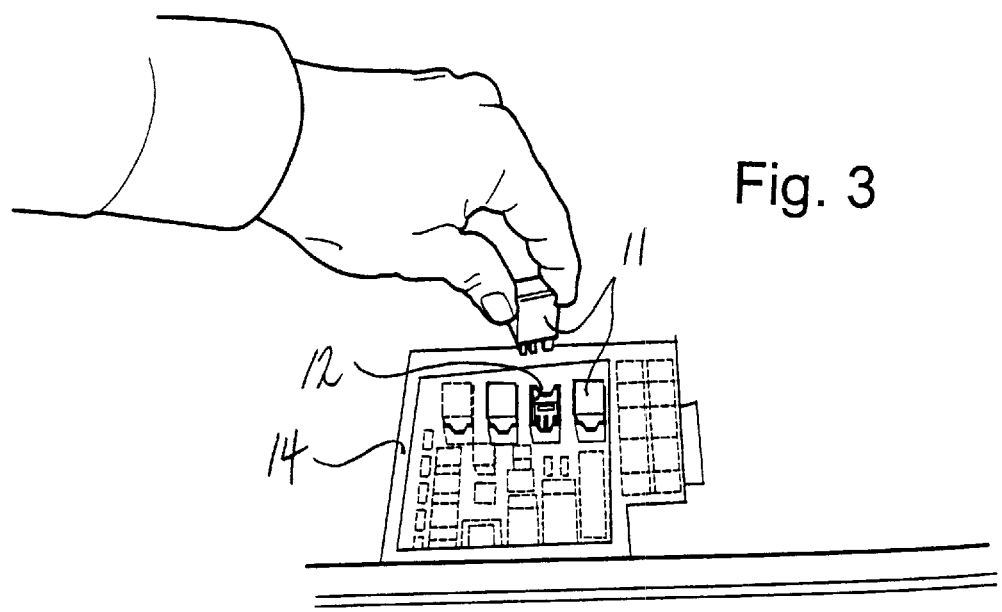
FIG. 3 is view of an automobile receptacle box, and showing an electric relay being removed from its relay receptacle.
Figure 4:
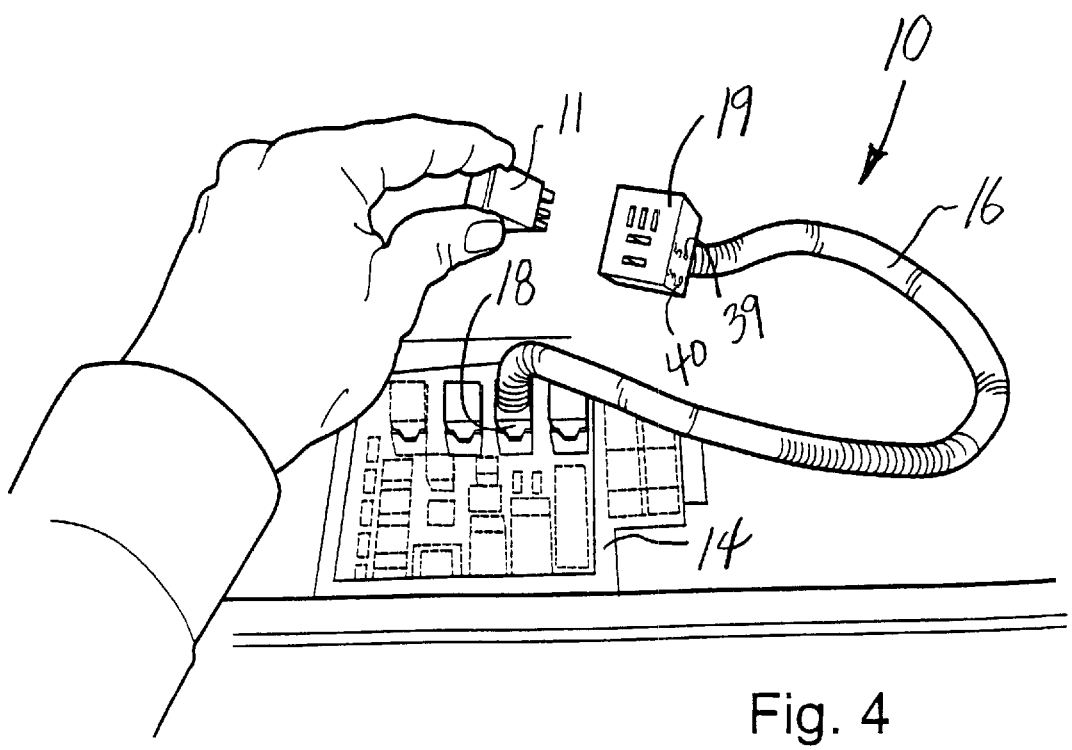
FIG. 4 is a view of the automobile receptacle box with the male connector of the test extender inserted into the relay receptacle, and showing the electric relay being inserted into the female connector of the test extender for diagnostic testing of the relay and circuit.

Referring now specifically to the drawings, a relay circuit test extender according to the present invention is illustrated in FIG. 1 and shown generally at reference numeral 10. The test extender 10 is especially applicable for use in the automotive industry as a diagnostic tool for improving the accessibility and testing of any given electric relay and relay circuit located in an automobile. As shown in FIGS. 3 and 4, automobile relays 11 are generally plugged into receptacles 12 of a central receptacle box 14 often located in a hard to reach area within the interior of the automobile.

Figure 2:
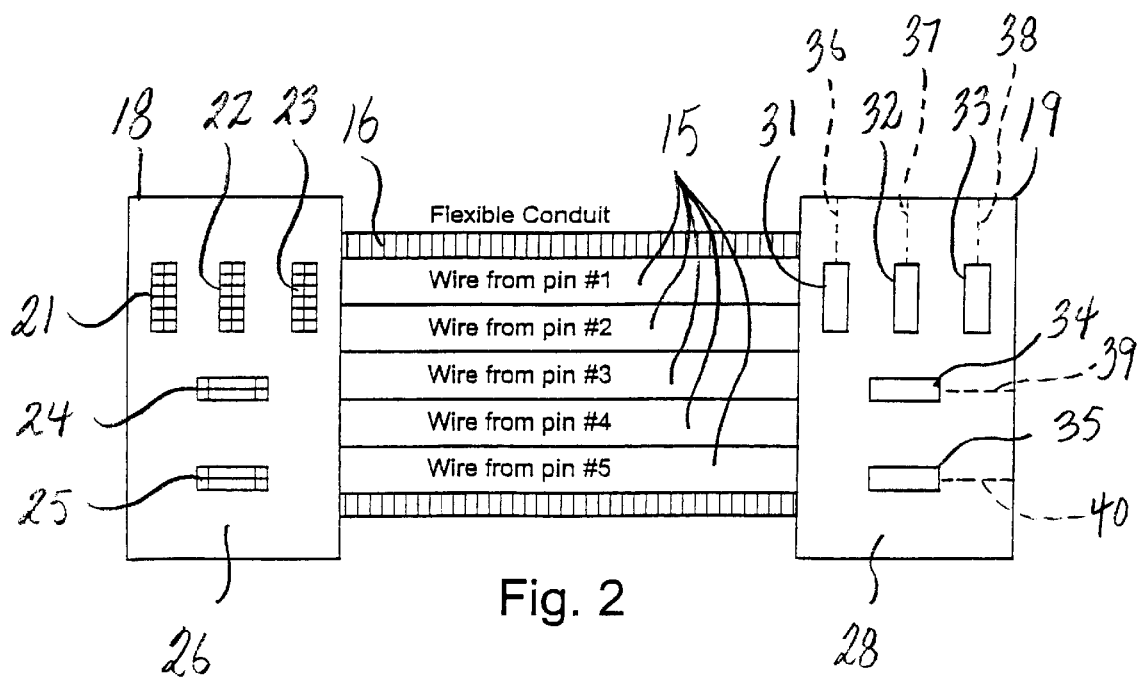
FIG. 2 is an enlarged schematic view illustrating the male and female connectors located at opposite ends of the test extender.

Referring to FIGS. 1 and 2, the test extender 10 includes a number of bundled electric wires 15 contained within an elongated flexible conduit 16, and having male and female connectors 18 and 19 located at respective opposing ends. The length of the bundled wires 15 and conduit 16 is preferably at least two feet. The male connector 18 has five outwardly projecting pins 21, 22, 23, 24, and 25 secured in a molded connector housing 26, and electrically connected to respective terminal ends of the wires 15. The pins 21–25 of the male connector 18 are configured to match those of a standard 5-pin removable automobile relay. The electric wires 15 extend from the pins 21–25 to the female connector 19. The female connector 19 includes a molded connector housing 28 defining five pin openings 31, 32, 33, 34, and 35 which communicate with respective opposite terminal ends of the wires 15. The pin openings 31–35 are configured to match the pin openings of the relay receptacle in the automobile. Five back probe ports 36, 37, 38, 39, and 40 are formed in the housing 28 of the female connector 19 to enable ready access to the wires 15 for back probe testing. The back probe ports 36–40 are preferably numbered on the housing 28 to clearly associate each port with its corresponding wire. Alternatively, the test extender may include any other number of male connector pins, female connector pin openings, and back probe ports appropriate for testing the particular automobile relay. Adapters may also be used to accommodate multiple different relays.

The process for testing a relay and relay circuit using the test extender 10 is described with reference to FIGS. 3 and 4. As shown in FIG. 3, the first step is to remove the electric relay 11 from the relay receptacle 12 of the automobile. This opens the relay circuit. The male connector 18 of the test extender 10 is then inserted into the vacant receptacle 12 in the receptacle box 14, as shown in FIG. 4. The test extender 10 is stretched out to space the female connector 19 a convenient distance away from the receptacle box 14 of the automobile. The electric relay 11 is then inserted into the female connector 19 to close and re-energize the relay circuit. The live circuit is now ready for testing using a handheld digital volt-ohm meter (DVOM) or other suitable device. Using a DVOM, the negative lead is first connected to the battery ground and the positive lead used to probe each of the test ports 36–40 (See FIG. 2) formed in the housing 28 of the female connector 19. The test ports 36–40 communicate with respective wires 15. Testing is preformed with the relay 11 in an at-rest state, shown in FIG. 5, and an energized state shown in FIG. 6.

Figure 5:
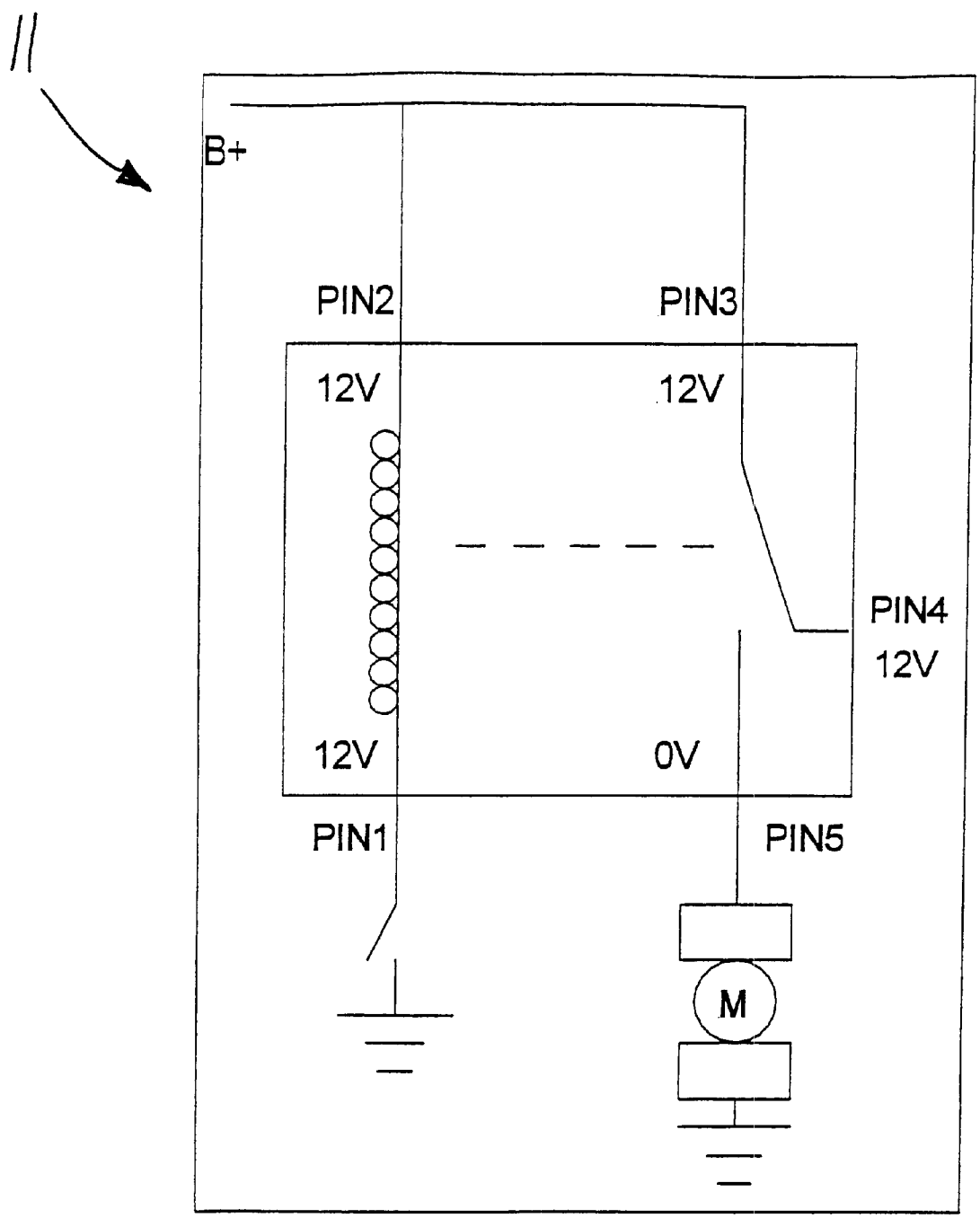
FIG. 5 is an electronic schematic of the relay in an at-rest state.
Figure 6:
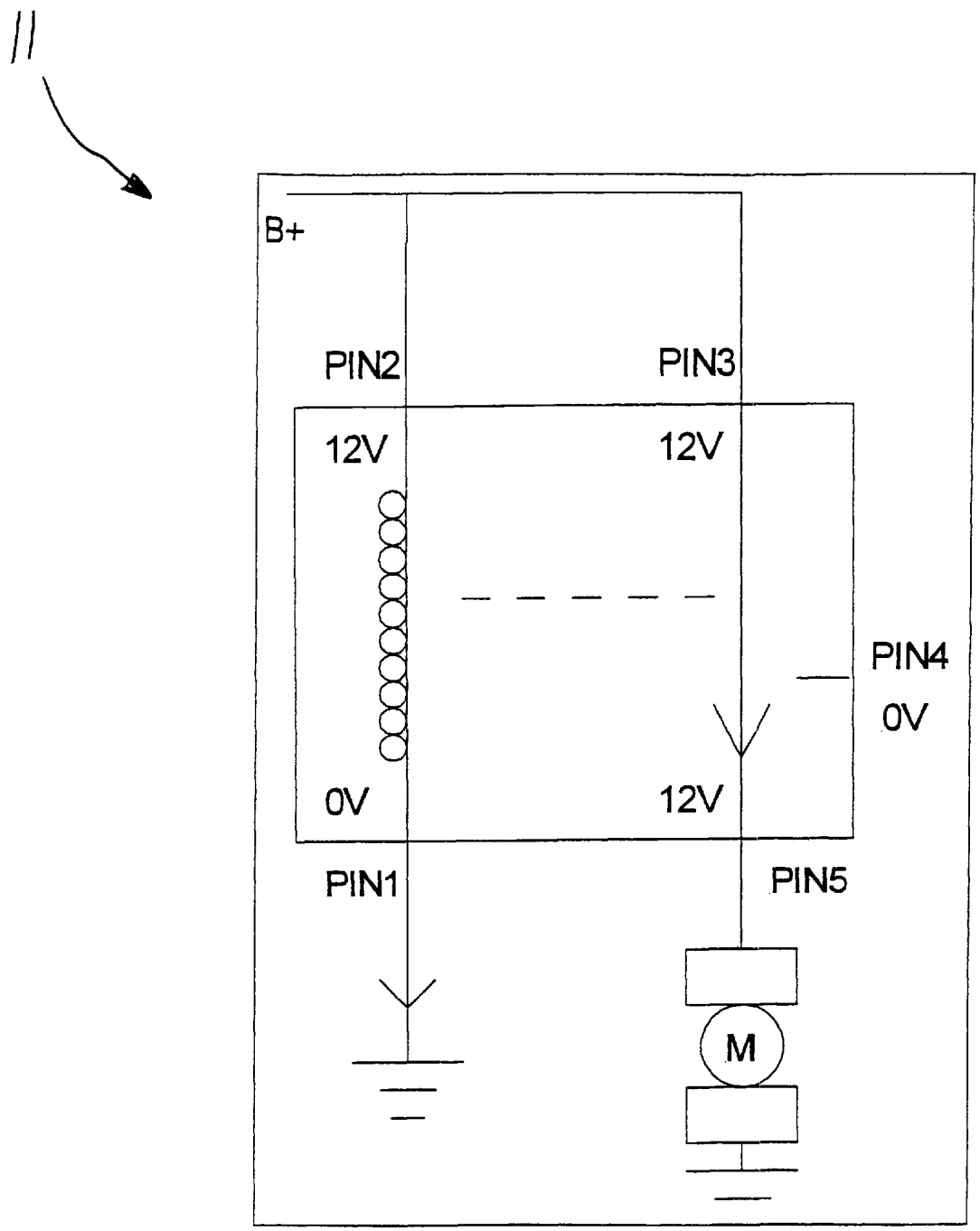
FIG. 6 is an electronic schematic of the relay in an energized state.

Referring to FIGS. 5 and 6, relay pin 1 electrically connects to the wire/circuit controlling ground at the coil side of the relay. Relay pin 2 carries voltage to the coil side of the relay. Relay pin 3 carries voltage to the contact or load side of the relay. Relay pin 4 is the contact location in an at-rest position. Relay pin 5 carries voltage out of the contact or load side of the relay towards the load. When in an at-rest state shown in FIG. 5, the voltage at relay pins 1, 2, 3, and 4 is greater than 10.5V. The voltage at pin 5 is less than 0.2V. When in an energized state, the voltage at relay pins 1 and 4 is less than 0.2V. The voltage at pins 2, 3, and 5 is greater than 10.5V.

The test results obtained using the DVOM, when interpreted by an experienced technician, will lead to the repair of any electrical problem in the relay and/or circuit. By comparing the actual readings received on the DVOM, to the pin voltages indicated above, a thorough diagnosis of the entire circuit can be made. Any readings not within these pin voltages indicate a problem area in the circuit.

A relay circuit test extender is described above. Various details of the invention may be changed without departing from its scope. Furthermore, the foregoing description of the preferred embodiment of the invention and the best mode of practicing the invention are provided for the purpose of illustration only and not for the purpose of limitation—the invention being defined by the claims.

I claim:

1. A relay circuit test extender adapted to facilitate testing of relays and relay circuits in a vehicle, said test extender comprising:

(a) a plurality of elongated bundled wires having first and second opposing ends, and adapted for carrying current in an electric circuit between a vehicle relay receptacle and a removable electric relay;

(b) a male connector located at the first end of said bundled wires, and including a plurality of electric pins electrically connected to respective wires and adapted for being inserted into respective pin openings of the vehicle relay receptacle;

(c) a female connector located at the second end of said bundled wires, and defining a plurality of pin openings adapted for receiving respective pins of the removable electric relay;

whereby upon connecting the male connector of said test extender to the vehicle relay receptacle and connecting the removable electric relay to the female connector of said test extender, the relay is tested in a live electric circuit at a location spaced apart from the vehicle relay receptacle.

2. A relay circuit test extender according to claim 1, wherein said female connector comprises a connector housing, said housing defining a plurality of back probe ports communicating with said plurality of wires to enable ready access to said wires for back probe testing.

3. A relay circuit test extender according to claim 1, wherein said bundled plurality of wires is contained in a flexible conduit.

4. A relay circuit test extender according to claim 1, wherein the length of said bundled plurality of wires is greater than two feet.

5. A relay circuit test extender according to claim 1, wherein said male connector comprises five electric pins and said female connector comprises five corresponding pin openings, such that said test extender is adapted for testing a removable five-pin electric relay.

6. A relay circuit test extender according to claim 5, wherein said female connector comprises a connector housing, said housing defining five back probe ports communicating with respective wires to enable ready access to said wires for back probe testing.

7. A relay circuit test extender according to claim 6, and comprising indicia provided on said connector housing and associated with each of said back probe ports to match said back probe ports to respective wires.

8. A relay circuit test extender according to claim 7, wherein said indicia comprises numbers identifying each of said wires.

9. A method for testing relays and relay circuits in a vehicle, comprising the steps of:

(a) electrically connecting a male connector of a relay circuit test extender to a vehicle relay receptacle, said test extender comprising a plurality of electric wires adapted for carrying current;

(b) locating a female connector of the relay circuit test extender a distance away from the vehicle relay receptacle; and (c) electrically connecting a removable electric relay to the female connector, such that the relay is tested in a live electric circuit at a location spaced apart from the vehicle relay receptacle.

10. A method for testing relays and relay circuits in a vehicle according to claim 9, and comprising testing the voltage from the removable electric relay by inserting a voltage testing device into back probe ports formed in the female connector of the relay circuit test extender.

11. A method for testing relays and relay circuits in a vehicle according to claim 10, wherein the step of testing the voltage from the removable electric relay comprises inserting a digital volt-ohm meter into the back probe ports of the female connector.

12. A method for testing relays and relay circuits in a vehicle according to claim 9, and comprising the step of locating the female connector of the relay circuit test extender a distance of at least two feet from the vehicle relay receptacle.

* * * * *